United States Patent
Heo

(10) Patent No.: US 12,032,005 B2
(45) Date of Patent: Jul. 9, 2024

(54) DEVICE AND METHOD FOR MONITORING COMMON MODE VOLTAGE

(71) Applicant: LG ENERGY SOLUTION, LTD., Seoul (KR)

(72) Inventor: Jin Seok Heo, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 185 days.

(21) Appl. No.: 17/628,146

(22) PCT Filed: Jan. 11, 2021

(86) PCT No.: PCT/KR2021/000307
§ 371 (c)(1),
(2) Date: Jan. 18, 2022

(87) PCT Pub. No.: WO2021/153923
PCT Pub. Date: Aug. 5, 2021

(65) Prior Publication Data
US 2022/0283206 A1   Sep. 8, 2022

(30) Foreign Application Priority Data
Jan. 30, 2020 (KR) .................. 10-2020-0011239

(51) Int. Cl.
*G01R 15/04* (2006.01)
*G01R 19/165* (2006.01)
(Continued)

(52) U.S. Cl.
CPC ....... *G01R 19/16576* (2013.01); *G01R 15/04* (2013.01); *G01R 19/2503* (2013.01); *H02J 7/0047* (2013.01); *H02J 2207/20* (2020.01)

(58) Field of Classification Search
CPC ............. G01R 15/04; G01R 19/16576; G01R 19/2503; G01R 19/2513; G01R 31/396;
(Continued)

(56) References Cited

U.S. PATENT DOCUMENTS 6,313,750 B1   11/2001   Lacy
9,178,421 B2 *  11/2015   Dally ................... H02M 3/158
(Continued)

FOREIGN PATENT DOCUMENTS

CN   104007391 A   8/2014
CN   106451772 A   2/2017
(Continued)

OTHER PUBLICATIONS

International Search Report for PCT/KR2021/000307 (PCT/ISA/210) dated Apr. 21, 2021.
European Search Report (EESR) 21748242.1 dated Nov. 10, 2022.

*Primary Examiner* — Vinh P Nguyen
(74) *Attorney, Agent, or Firm* — Birch, Stewart, Kolasch & Birch, LLP

(57) ABSTRACT

Disclosed is a device and method for monitoring a common mode voltage. There is provided the device for monitoring a common mode voltage including an input end connected to a node between an energy storage device and a power conversion device, a voltage divider that divides a voltage applied to the input end, a comparator that compares an output of the voltage divider and a reference voltage, and a controller that detects an abnormality in a voltage applied from the power conversion device to the energy storage device based on an output of the comparator.

20 Claims, 9 Drawing Sheets

(51) Int. Cl.
*G01R 19/25* (2006.01)
*H02J 7/00* (2006.01)

(58) Field of Classification Search
CPC .. G01R 31/3835; G01R 31/006; G01R 31/54;
G01R 31/3842; G01R 19/16542; G01R
31/3648; G01R 31/382; G01R 31/392;
G01R 19/0084; G01R 31/2836; G01R
31/343; G01R 31/1218; G01R 1/3647;
G01R 31/3647; H02J 2207/20; H02J
3/32; H02J 7/0047; Y02E 60/10; Y02E
60/32; Y02E 10/20
See application file for complete search history.

(56) References Cited

U.S. PATENT DOCUMENTS

| | | | |
|---|---|---|---|
| 9,306,409 B2 * | 4/2016 | Yoo | H02J 3/32 |
| 9,341,665 B2 * | 5/2016 | Kaminski | B60L 3/0069 |
| 9,444,390 B2 * | 9/2016 | Yeo | H02P 29/00 |
| 2009/0184717 A1 | 7/2009 | Ivan et al. | |
| 2010/0284207 A1 | 11/2010 | Watanabe et al. | |
| 2010/0327806 A1 | 12/2010 | Brisebois | |
| 2012/0194199 A1 | 8/2012 | Mizoguchi | |
| 2014/0035365 A1 | 2/2014 | Yoo | |
| 2014/0062407 A1 | 3/2014 | Brisebois | |
| 2015/0357961 A1 | 12/2015 | Yeo | |
| 2016/0245853 A1 | 8/2016 | Weiss et al. | |
| 2017/0199243 A1 | 7/2017 | Narita | |
| 2017/0307690 A1 | 10/2017 | Park | |
| 2018/0088178 A1 | 3/2018 | Inamoto et al. | |
| 2018/0364284 A1 | 12/2018 | Kim et al. | |

FOREIGN PATENT DOCUMENTS

| | | | |
|---|---|---|---|
| CN | 108832686 A | | 11/2018 |
| CN | 109094490 A | | 12/2018 |
| CN | 101881794 A | | 3/2024 |
| JP | 6-153303 A | | 5/1994 |
| JP | 7-20185 A | | 1/1995 |
| JP | 7-203601 A | | 8/1995 |
| JP | 4106496 B2 | | 6/2008 |
| JP | 2014-103819 A | | 6/2014 |
| JP | 2014-147161 A | | 8/2014 |
| JP | 2017-125687 A | | 7/2017 |
| JP | 2018-48959 A | | 3/2018 |
| KR | 2000-0010233 A | | 2/2000 |
| KR | 20120073520 | * | 7/2012 |
| KR | 10-1364459 B1 | | 2/2014 |
| KR | 10-1522475 B1 | | 5/2015 |
| KR | 10-1592702 B1 | | 2/2016 |
| KR | 10-1631064 B1 | | 6/2016 |
| KR | 10-1711706 B1 | | 3/2017 |
| KR | 10-2017-0121217 A | | 11/2017 |
| KR | 10-2018-0066631 A | | 6/2018 |
| KR | 1020180066631 A | * | 6/2018 |
| KR | 10-2019-0012718 A | | 2/2019 |
| KR | 10-1925773 B1 | | 3/2019 |
| KR | 10-1955537 B1 | | 3/2019 |
| KR | 10-1769357 B1 | | 3/2024 |
| WO | WO 98/39624 A1 | | 9/1998 |

* cited by examiner

DEVICE AND METHOD FOR MONITORING COMMON MODE VOLTAGE

CROSS-REFERENCE TO RELATED APPLICATIONS

This application claims the benefit of Korean Patent Application No. 10-2020-0011239, filed on Jan. 30, 2020, in the Korean Intellectual Property Office, the disclosure of which is incorporated herein in its entirety by reference.

TECHNICAL FIELD

The present invention relates to a device and method for monitoring a common mode voltage.

BACKGROUND ART

Recently, research on a secondary battery as a power supply source is being actively conducted in accordance with the spread of an electronic device such as a smartphone, an uninterruptible power supply (UPS), and an electric vehicle, and expansion of infrastructure for an energy storage device (ESS; energy storage system).

In the case of an energy storage device, it not only needs to store a large amount of electric energy, but also requires high output. To this end, the energy storage device is used in the form of a battery rack including a plurality of battery modules connected in series and/or in parallel and a charging and discharging device for charging and discharging the plurality of battery modules. The battery module includes battery cells, which are secondary batteries, connected in series and/or in parallel. Further, the battery rack includes a rack controller (RBMS; rack battery management system) for controlling the charging and discharging device, and a plurality of module controllers (MBMS; module battery management system) that respectively control the plurality of battery modules.

Further, a power conversion device (PCS; power conversion system) is installed outside the energy storage device for charging and discharging. The power conversion device converts AC power of a system into DC power and supplies DC power to the energy storage device, or converts DC power of the energy storage device into AC power and supplies AC power to the system. Switching noise occurs in accordance with switching performed during this power conversion. Switching noise is caused on a common mode voltage transmitted in a power line between the power conversion device and the energy storage device, which affects an operation and safety of a battery system such as the energy storage device. Accordingly, it is necessary to accurately monitor the common mode voltage for stable operation of the battery system.

DISCLOSURE OF THE INVENTION

Technical Problem

The present invention has been made to solve the problems described above, and an object thereof is to accurately detect a common mode voltage transmitted in a power line between the power conversion device and the energy storage device.

Technical Solution

In order to solve the technical problems as described above, according to one aspect of embodiments of the present invention, there is provided a device for monitoring a common mode voltage including an input end connected to a node between an energy storage device and a power conversion device, a voltage divider that divides a voltage applied to the input end, a comparator that compares an output of the voltage divider and a reference voltage, and a controller that detects an abnormality in a voltage applied from the power conversion device to the energy storage device based on an output of the comparator.

According to another feature of the device for monitoring the common mode voltage of this embodiment, the comparator may include a plurality of comparators, and at least some of the plurality of comparators may be configured to compare different reference voltages to the output of the voltage divider.

According to another feature of the device for monitoring the common mode voltage of this embodiment, the comparator may be included in the controller, and may compare a value obtained by converting the output of the voltage divider into a digital value with a digital value corresponding to the reference voltage.

According to another feature of the device for monitoring the common mode voltage of this embodiment, a terminal portion for communicating with outside of the device, and a power supply portion that generates power based on an input from the terminal portion may be further included.

According to another feature of the device for monitoring the common mode voltage of this embodiment, an isolator formed between a high voltage circuit portion and a low voltage circuit portion the high voltage circuit portion includes the input end, the voltage divider, the comparator, and the low voltage circuit portion includes the terminal portion and the power supply portion to insulate the high voltage circuit portion from the low voltage circuit portion.

According to another feature of the device for monitoring the common mode voltage of this embodiment, the isolator may include a power isolator for supplying power from the low voltage circuit portion to the high voltage circuit portion, and a communication isolator for transmitting an input from the terminal portion to the controller.

According to another feature of the device for monitoring the common mode voltage of this embodiment, the controller may transmit an error signal to outside of the device when an abnormality is detected, by the controller, in the voltage applied to the energy storage device.

According to another feature of the device for monitoring the common mode voltage of this embodiment, the controller may transmit the error signal to a battery management system of the energy storage device.

According to another feature of the device for monitoring the common mode voltage of this embodiment, the controller may transmit the error signal to an upper level controller that manages the energy storage device.

According to another feature of the device for monitoring the common mode voltage of this embodiment, the voltage applied to the input end may be a voltage between the node and a chassis that is the ground of the energy storage device.

In order to solve the technical problems as described above, according to another aspect of embodiments of the present invention, there is provided a method of controlling a device for monitoring a common mode voltage connected to a node between an energy storage device and a power conversion device, the method including dividing a voltage between the node and a chassis of the energy storage device, comparing the divided voltage and a reference voltage, and detecting an abnormality in a voltage applied from the power conversion device to the energy storage device based on a comparison result.

Advantageous Effects

According to the device and method for monitoring the common mode voltage described above, it is possible to accurately detect the common mode voltage transferred in the power line between the conversion device and the energy storage device, thereby enabling stable operation of the battery system.

MODE FOR CARRYING OUT THE INVENTION

Figure 1:
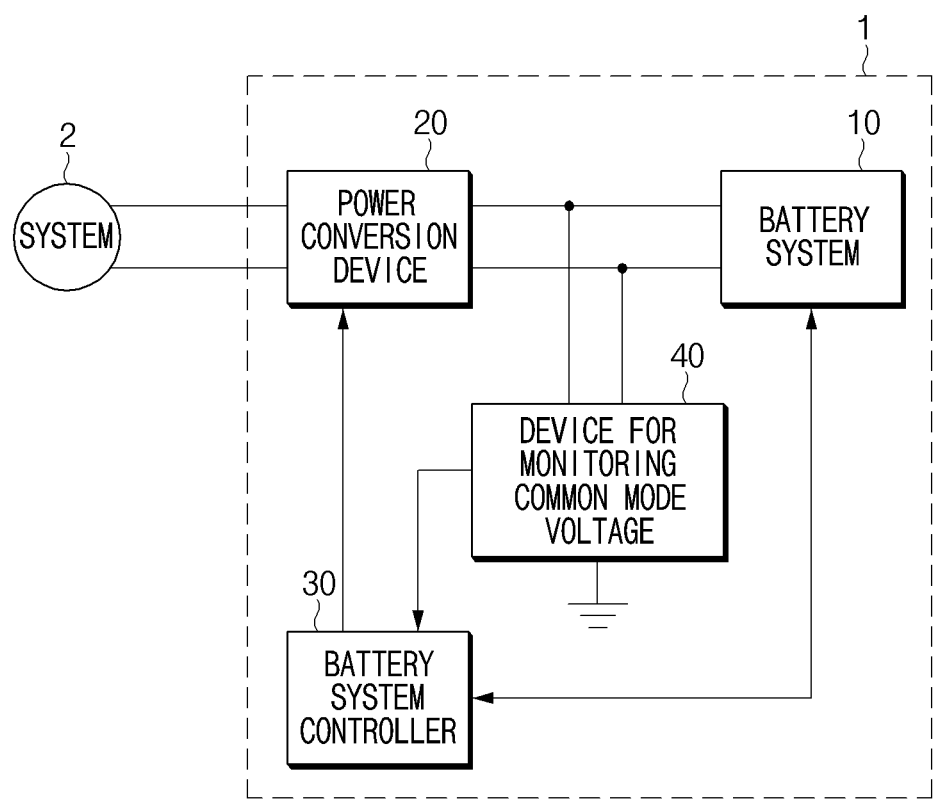
FIG. 1 is a diagram schematically illustrating a configuration of an energy storage system to which a device for monitoring a common mode voltage according to an embodiment of the present invention is applied.

Hereinafter, various embodiments of the present invention will be described in detail with reference to the accompanying drawings. In this document, the same reference numerals are used for the same constituent elements in the drawings, and duplicate descriptions for the same constituent elements are omitted.

With respect to the various embodiments of the present invention disclosed in this document, specific structural or functional descriptions have been exemplified for the purpose of describing the embodiments of the present invention only, and various embodiments of the present invention may be embodied in various forms and should not be construed as being limited to the embodiments described in this document.

Expressions such as "first", "second", "firstly", or "secondly", etc. used in various embodiments may modify various constituent elements regardless of order and/or importance, and do not limit corresponding constituent elements. For example, without deviating from the scope of the present invention, a first constituent element may be named as a second constituent element, and similarly, the second constituent element may also be renamed as the first constituent element.

The terms used in this document are only used to describe a specific embodiment, and may not be intended to limit the scope of other embodiments. Singular expressions may include plural expressions unless the context clearly indicates otherwise.

FIG. 1 is a diagram schematically illustrating a configuration of an energy storage system to which a device for monitoring a common mode voltage according to an embodiment of the present invention is applied.

Referring to FIG. 1, a power system 1 is a system that is connected to a system 2 to receive power or supply power to the system 2 and a load. The power system 1 includes a battery system 10, a power conversion device 20, a battery system controller 30, and a device 40 for monitoring a common mode voltage (hereinafter, simply referred to as a 'monitoring device').

The battery system 10 refers to an energy storage device that stores power. The battery system 10 may be provided in the form of a battery rack or a battery bank including a plurality of battery racks. The battery system 10 may be charged using DC power supplied from the power conversion device 20. The battery system 10 may perform a discharging operation by outputting DC power and supplying DC power to the power conversion device 20.

The operation of the battery system 10 may be controlled by a battery system controller (BSC) 30. The battery system 10 communicates with the battery system controller 30 to transmit data related to the battery system 10. For example, the battery system 10 may transmit a value obtained by measuring the temperature and voltage of the battery system 10 or parameters such as SOC and SOH derived therefrom to the battery system controller 30. Although not illustrated, in the battery system 10, various devices for monitoring a state of the battery system 10 and a controller for communication with the battery system controller 30 may be provided therein.

The power conversion device 20 converts AC power supplied from the system 2 into DC power. The power conversion device 20 supplies the converted DC power to the battery system 10. The power conversion device 20 converts DC power supplied from the battery system 10 into AC power. The power conversion device 20 supplies the converted AC power to the system 2. Further, although not illustrated, the power conversion device 20 may supply the converted AC power to the load.

The power conversion device 20 may include an inverter and a converter for conversion between DC power and AC power. The power conversion device 20 may perform a power conversion operation under the control of the battery system controller 30.

The battery system controller 30 manages each component included in the power system 1 and controls the overall operation. The battery system controller 30 may communicate with a controller provided in the battery system 1. The battery system controller 30 may transmit a control signal to the battery system 1 to control the operation of the battery system 1. Further, the battery system controller 30 may receive data from the battery system 1 and manage the state of the battery system 1. The battery system controller 30 may transmit a control signal to the power conversion device 20 to control a power conversion operation of the power conversion device 30.

The battery system controller 30 also receives a monitoring result of a common mode voltage between the power conversion device 20 and the battery system 10 which is an energy storage device from the monitoring device 40. When the battery system controller 30 receives a notification that there is an abnormality in the common mode voltage from the monitoring device 40, the battery system controller 30 may transmit the notification to the outside. For example, the battery system controller 30 may be a subject operating the power system 1.

The monitoring device 40 monitors the common mode voltage between the power conversion device 20 and the battery system 10 which is an energy storage device. That is, the monitoring device 40 monitors the voltage between a cathode line between the power conversion device 20 and the battery system 10 and a reference potential (e.g., ground). Further, the monitoring device 40 monitors the voltage between an anode line between the power conversion device 20 and the battery system 10 and a reference potential (e.g., ground). The reference potential in this case may be the ground of the battery system 10, for example, a chassis of the battery rack.

When an abnormality is found in the measured voltage, the monitoring device 40 transmits the fact that the abnormality is found in the measured voltage to the battery system controller 30. The monitoring device 40 transmits an alarm or warning indicating an abnormality in the common mode voltage to the battery system controller 30.

Hereinafter, a configuration of the battery system 10 will be described in more detail.

Figure 2:
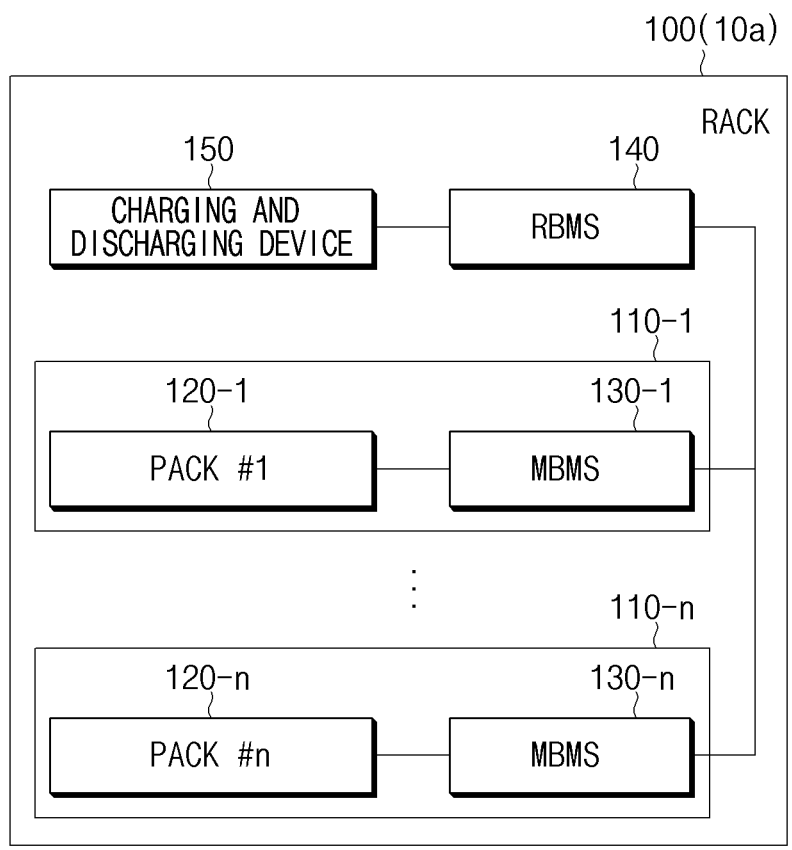
FIG. 2 is a diagram illustrating a configuration of a battery system according to an embodiment of the present invention.

FIG. 2 is a diagram illustrating a configuration of a battery system 10a according to an embodiment of the present invention.

The battery system 10a according to the present embodiment may be a battery rack 100. The battery rack 100 includes a plurality of battery modules 110-1 to 110-n each including a battery pack (battery cell assembly) 120 and a module controller (MBMS) 130. The battery rack 100 further includes a charging and discharging device 150 for charging and discharging the battery module 110 and a rack controller (RBMS) 140. (In this embodiment, when there is no need to distinguish between the battery modules, the module controllers, and the battery packs, reference numerals thereof will be denoted as 110, 120, and 130, respectively.)

The battery module 110 is a component that is mounted on the battery rack 100 to store power. A plurality of battery modules 110 may be provided according to specifications required for the battery rack 100. The plurality of battery modules 110 may be connected in series and/or parallel within the battery rack 110 to provide a required output. The battery module 110 includes a battery pack 120 that stores power and a module controller 130 that controls the operation of the battery pack 120.

The battery pack 120 is a component that stores power and includes a plurality of battery cells. The battery pack 120 may include a plurality of battery cells connected in series and/or in parallel. The number and connection type of the battery cells may be determined according to the required output of the battery pack 120. The battery cell included in the battery pack 120 may be a secondary battery such as a lithium ion (Li-ion) battery, a lithium ion polymer battery, a nickel cadmium (Ni—Cd) battery, and a nickel hydride (Ni-MH) battery, but is not limited thereto.

The module controller 130 controls charging and discharging of the battery pack 120, and manages the state thereof. The module controller 130 may monitor voltage, current, temperature, etc. of the battery pack 120. Further, the module controller 130 may additionally include a sensor or various measurement modules (not illustrated) for monitoring. The module controller 40 may calculate parameters indicating the state of the battery pack 120, for example, SOC or SOH, based on measured values such as the monitored voltage, current, and temperature.

The module controller 130 may be configured to communicate with the rack controller 140. The module controller 130 may receive a control signal such as a command for controlling the battery pack 120 from the rack controller 140. The module controller 130 may transmit the measured value by the monitoring described above or the parameter calculated from the measured value to the rack controller 140.

The rack controller 140 and a plurality of module controllers 130-1 to 130-n are collectively referred to as a battery management system (BMS). The rack controller 20 of the battery management system (BMS) and the plurality of module controllers 40-1 to 40-n may perform communication in a wired and/or wireless manner. For example, when wired communication is applied within the battery management system, communication may be performed with each other using a communication protocol of differential input mode. Examples of the communication protocol of differential input mode include controller area network (CAN) recommended standard 485 (RS-485), recommended standard 422 (RS-422), etc. Further, when wireless communication is applied within the battery management system, wireless communication protocols such as wi-fi (registered trademark) and Bluetooth (registered trademark) may be used. However, the wired and wireless communication protocols are only examples, and are not limited thereto.

The charging and discharging device 150 charges and discharges the battery module 110. The charging and discharging device 150 supplies power to the battery module 110 or supplies power from the battery module 110 to a system or a load. The charging and discharging device 150 may be connected to a system to receive power from the system, and may supply the received power to the battery module 110. Further, the charging and discharging device 150 may supply power discharged from the battery module 110 to the system or the load (e.g., a factory, a home, etc.). The charging and discharging device 150 may include a switching device for charging and discharging the battery module 110, for example, a relay.

The battery system 10a may be provided in the form of a battery rack 100 as described above and connected to the power conversion device 20.

Figure 3:
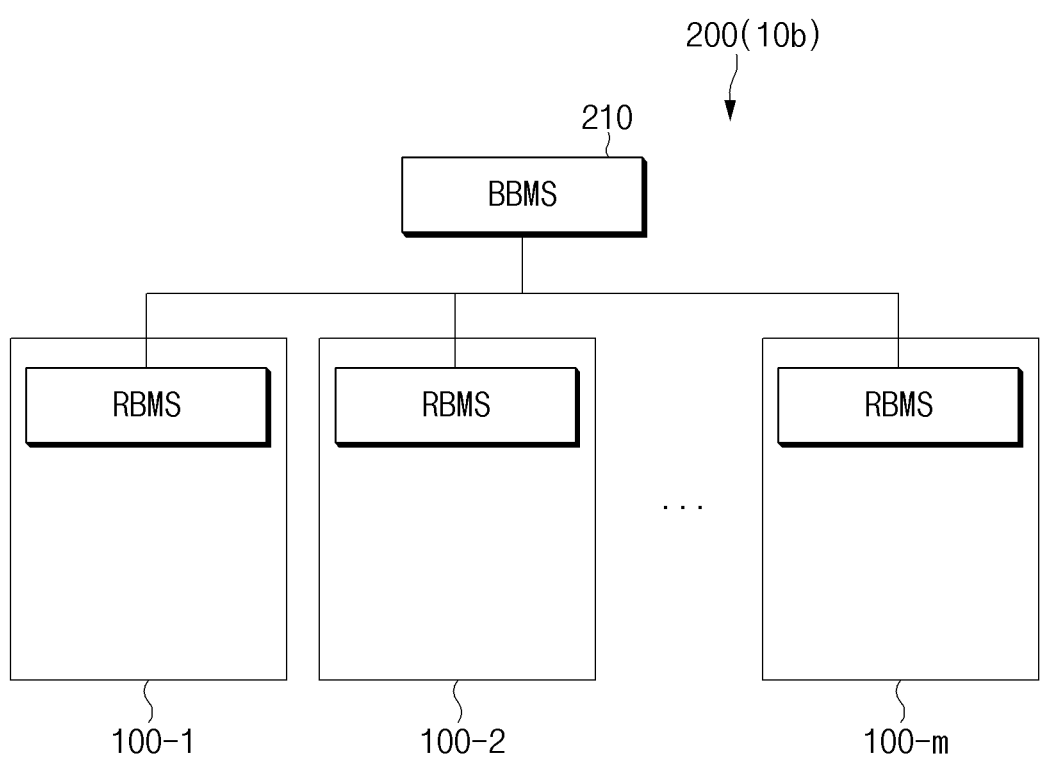
FIG. 3 is a diagram illustrating the configuration of the battery system according to another embodiment of the present invention.

FIG. 3 is a diagram illustrating a configuration of a battery system 10b according to another embodiment of the present invention.

The battery system 10b according to this embodiment may be a battery bank 200. The battery bank 200 includes a plurality of battery racks 100-1 to 100-m and a bank controller (BBMS; bank battery management system) 210.

Each of the plurality of battery racks 100-1 to 100-n corresponds to the battery rack 100 described in FIG. 2. Each of these battery racks 100 include a rack controller (RBMS) that manages the battery rack 100 and controls its operation.

The bank controller 210 may receive various data by performing communication with the rack controllers (RBMS) included in the plurality of battery racks 100. Further, the bank controller 210 may control the operation of the battery rack 100 by transmitting a control signal to the rack controller (RBMS). To this end, the bank controller 210 may perform communication with the rack controller (RBMS) in a wired or wireless manner. A protocol for wired or wireless communication is not particularly limited, and a protocol suitable for operating the battery bank 200 may be selected. Further, in this embodiment, a plurality of battery racks 100 are illustrated to be included in the battery bank 200, but is not limited thereto, and only a single battery rack 100 may be included therein.

The battery system 10a may be provided in the form of the battery bank 200 as described above and may be connected to the power conversion device 20.

Hereinafter, the monitoring device 40 that may be installed between the battery system 10 and the power conversion device 20 described above will be described in detail.

Figure 4:
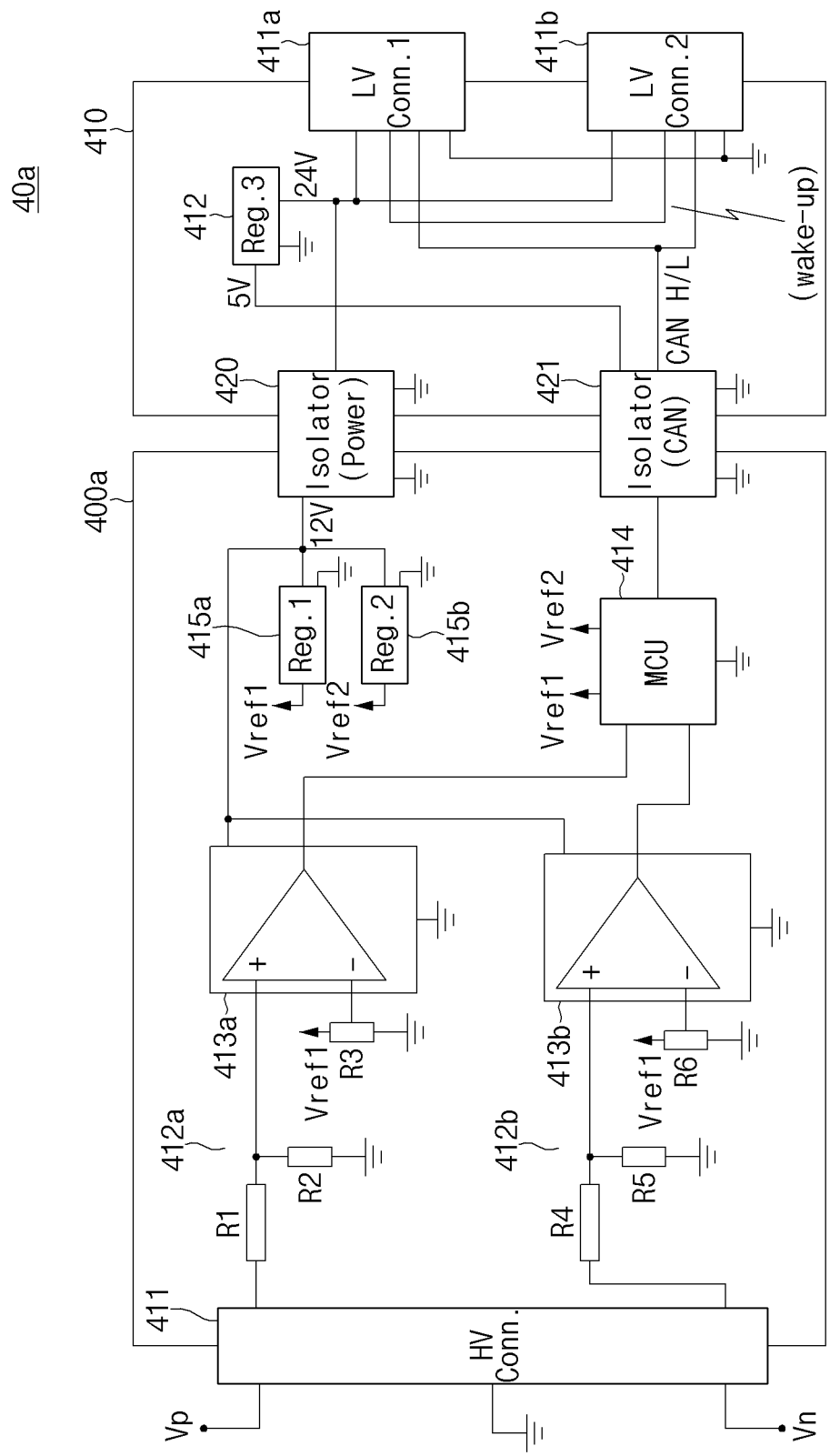
FIG. 4 is a diagram illustrating a configuration of the device for monitoring the common mode voltage according to an embodiment of the present invention.

FIG. 4 is a diagram illustrating a configuration of a device 40a for monitoring a common mode voltage according to an embodiment of the present invention.

The monitoring device 40a includes an input end 411, voltage dividers 412a and 412b, comparators 413a and 413b, and a controller 414.

The input end 411 is connected to a node between the battery system 10 which is an energy storage device and the power conversion device 20. A voltage according to the power transferred between the battery system 10 and the power conversion device 20 is applied to the input end 411. A high voltage is applied to the input end 411, and thus, the input end 411 may be configured as a connector having high withstand voltage characteristics. The input end 411 is provided with a terminal for measuring a voltage Vp of a cathode line and a terminal for measuring a voltage Vn of an anode line, respectively.

The voltage dividers 412a and 412b divide the voltage applied to the input end 411. That is, the voltage dividers 412a and 412b serve to lower the applied common mode voltage to a predetermined magnitude. The voltage dividers 412a and 412b include a voltage divider 412a for dividing the voltage Vp of the cathode line and a voltage divider 412b for dividing the voltage Vn of the anode line.

The voltage divider 412a may include a plurality of resistors R1 and R2 for dividing the voltage Vp between the cathode line and the ground into a desired voltage. The resistances of the resistors R1 and R2 may be appropriately determined according to the magnitude of the reference voltage used by the comparator 413a. The voltage divided by the voltage divider 412a is applied to the comparator 413a. In the voltage divider 412a, a node between the resistors R1 and R2 is connected to the comparator 413a.

Similarly, the voltage divider 412b may include a plurality of resistors R4 and R5 for dividing the voltage Vn between the anode line and the ground into a desired voltage. The resistances of the resistors R4 and R5 may be appropriately determined according to the magnitude of the reference voltage used by the comparator 413b. The voltage divided by the voltage divider 412b is applied to the comparator 413b. In the voltage divider 412b, the node between the resistors R4 and R5 is connected to the comparator 413b.

Comparators 413a and 413b compare the outputs of the voltage dividers 412a and 412b with a reference voltage Vref1. The comparators 413a and 413b compare the voltage obtained by dividing the voltages Vp and Vn of the cathode line and anode line, respectively, by the voltage dividers 412a and 412b with the reference voltage Vref1. To this end, a non-inverting terminal of the comparator 413a may be connected to the node between the resistors R1 and R2. An inverting terminal of the comparator 413a may be connected to a node between the reference voltage Vref1 and a resistor R3. The reference voltage Vref1 may be generated by a regulator to be described later. Similarly, a non-inverting terminal of the comparator 413b may be connected to a node between resistors R4 and R5. An inverting terminal of the comparator 413b may be connected to a node between the reference voltage Vref1 and a resistor R6.

A predetermined voltage may be applied to the comparators 413a and 413b as power. The voltage applied to the comparators 413a and 413b may be a voltage supplied from a low voltage circuit portion 410 to be described later. However, this is an exemplary configuration, and the power used may be differently set according to the voltage required for the operation of the comparators 413a and 413b. For example, a voltage generated by one of a first regulator 415a and a second regulator 415b to be described later may be used as power.

The controller 414 (MCU) detects an abnormality in the voltage applied from the power conversion device 20 to the energy storage device based on outputs of the comparators 413a and 413b. That is, the controller 414 determines whether output voltages of the voltage dividers 412a and 412b, which are voltages applied to the non-inverting terminals, exceed the reference voltage based on the outputs of the comparators 413a and 413b. When it is determined that the output voltages of the voltage dividers 412a and 412b exceed the reference voltage, the controller 414 determines that there is an abnormality in the common mode voltage between the power conversion device 20 and the battery system 10. Meanwhile, when it is determined that the output voltages of the voltage dividers 412a and 412b do not exceed the reference voltage, the controller 414 determines that there is no abnormality in the common mode voltage between the power conversion device 20 and the battery system 10.

When it is determined that there is an abnormality in the common mode voltage, the controller 414 transmits an error signal to an external device. For example, the controller 414 transmits an error signal to the battery management system of the battery system 10 which is an energy storage device. The battery management system of the battery system 10 may be, for example, the rack controller 140 of FIG. 2, the bank controller 210 of FIG. 3, etc. Alternatively, the controller 414 may transmit the error signal to the battery system controller 30 that is an upper level controller.

A high voltage circuit portion 400a may be configured to include the input end 411, the voltage dividers 412a and 412b, the comparators 413a and 413b, and the controller 414. The high voltage circuit portion 400a is a region that handles a relatively high voltage, and may include a regulator 415a, 415b for supplying power therein. The first regulator 415a and the second regulator 415b may respectively generate a first reference voltage Vref1 and a second reference voltage Vref2 by using power supplied from the low voltage circuit portion 410. The first reference voltage Vref1 generated by the first regulator 415a and the second reference voltage Vref2 generated by the second regulator 415b may be provided to the comparators 413a and 413b or the controller 414. In this embodiment, the first regulator 415a and the second regulator 415b are included, but is not limited thereto, and one or three or more regulators may be included.

Meanwhile, the high voltage circuit portion 400a may be insulated from and connected to the low voltage circuit portion 410 through isolators. The isolators connecting the high voltage circuit portion 400a and the low voltage circuit portion 410 may include a first isolator 420 for power and a second isolator 421 for communication.

The low voltage circuit unit 410 may include terminal portions 411a and 411b and a power supply portion 412.

The terminal portions 411*a* and 411*b* are components for communicating with the outside. Each of the terminal portions 411*a* and 411*b* may include a power terminal and a communication terminal. The terminal portions 411*a* and 411*b* may receive power from the outside using the power terminal. The terminal portions 411*a* and 411*b* may communicate with an external device through the communication terminal. In the present embodiment, it is illustrated that two terminal portions are provided, but is not limited thereto. The number of terminal portions may be appropriately determined according to the specification or installation type of the monitoring device 40*a*.

Power supplied through the terminal portions 411*a* and 411*b* is provided to the power supply portion 412/regulator 3. For example, the terminal portions 411*a* and 411*b* may receive power of 24V from the outside and provide the power to the power supply portion 412. The power supply portion 412 may be, for example, a regulator. That is, the power supply portion 412 generates power based on inputs from the terminal portions 411*a* and 411*b*. The power supply portion 412 may apply the generated voltage to the second isolator 421 as a driving voltage.

The first isolator 420 supplies power from the low voltage circuit portion 410 to the high voltage circuit portion 400*a* while insulating the high voltage circuit portion 400*a* from the low voltage circuit unit 410. The first regulator 415*a* and the second regulator 415*b* of the high voltage circuit portion 400*a* generate the first reference voltage Vref1 and the second reference voltage Vref2, respectively, using power transferred through the first isolator 420.

The second isolator 421 transmits the input from the terminal portions 411*a* and 411*b* of the low voltage circuit portion 410 to the controller 414 of the high voltage circuit portion 400*a* while insulating the high voltage circuit portion 400*a* from the low voltage circuit portion 410. That is, the second isolator 421 provides a path for the controller 414 to perform communication through the terminal portions 411*a* and 411*b* of the low voltage circuit unit 410.

Meanwhile, as illustrated in FIG. 4, a line through which a communication signal such as a wake-up signal can be directly transferred may be provided between the terminal portion 411*a* and the terminal portion 411*b*.

The common mode voltage between the power conversion device 20 and the battery system 10 can be accurately monitored by the monitoring device 40*a* as described above. As a result, it is possible to stably operate the battery system 10 and furthermore the power system 1.

Further, when an abnormality in the common mode voltage is detected, it means that noise caused by the switching of the power conversion device 20 is large, and thus it is possible to prevent a larger failure in advance by checking the power conversion device 20.

Figure 5:
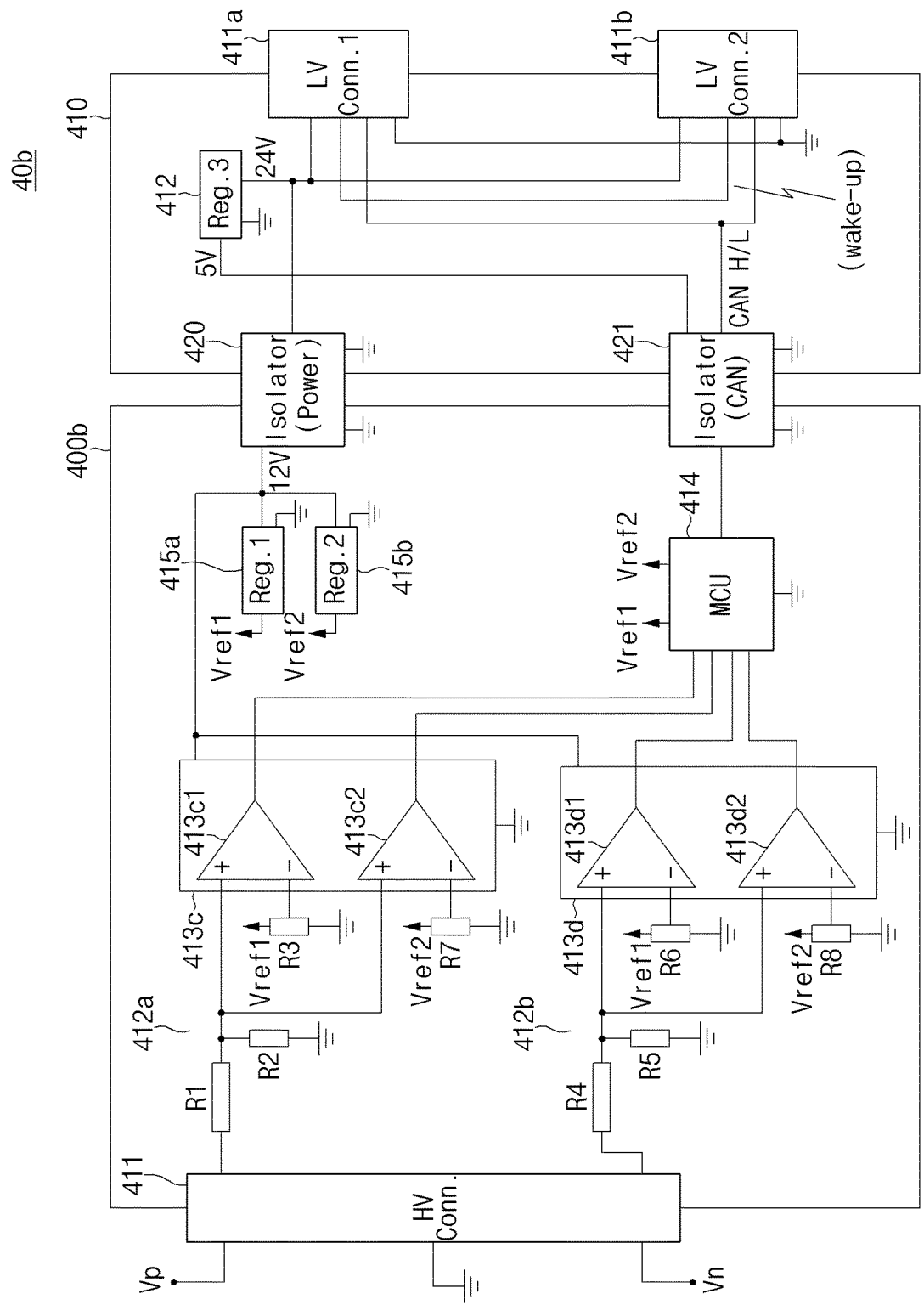
FIG. 5 is a diagram illustrating the configuration of the device for monitoring the common mode voltage according to another embodiment of the present invention.

FIG. 5 is a diagram illustrating a configuration of a common mode voltage monitoring device 40*b* according to another embodiment of the present invention. The monitoring device 40*b* according to FIG. 5 is different from the monitoring device 40*a* according to FIG. 4 in the configuration of comparators 413*c* and 413*d* of the low-voltage circuit portion 400*b*, but the other configurations are the same. Hereinafter, the difference described above will be mainly described.

Referring to FIG. 5, the monitoring device 40*b* according to this embodiment monitors the voltage Vp of the cathode line and the voltage Vn of the anode line using a plurality of reference voltages. To this end, the comparator 413*c* for monitoring the voltage Vp of the cathode line includes a first comparator 413*c*1 and a second comparator 413*c*2. Further, the comparator 413*d* for monitoring the voltage Vn of the anode line includes a third comparator 413*d*1 and a fourth comparator 413*d*2.

The first comparator 413*c*1 compares the voltage divided by the voltage divider 412*a* with the reference voltage Vref1, similar to the comparator 413*a* of FIG. 4. The second comparator 413*c*2 compares the voltage divided by the voltage divider 412*a* with the reference voltage Vref2. The reference voltage Vref2 is a voltage different from the reference voltage Vref1.

The third comparator 413*d*1 also compares the voltage divided by the voltage divider 412*b* with the reference voltage Vref1, similar to the comparator 413*b* of FIG. 4. Further, the fourth comparator 413*d*2 compares the voltage divided by the voltage divider 412*b* with the reference voltage Vref2.

As described above, the monitoring device 40*b* may include the plurality of comparators 413*c*1, 413*c*2, 413*d*1, and 413*d*2, and at least some of the plurality of comparators may be configured to compare different reference voltages with the output of the voltage divider.

The controller 414 detects an abnormality in the common mode voltage based on the outputs from the plurality of comparators 413*c*1, 413*c*2, 413*d*1, and 413*d*2. In this case, the controller 414 may detect whether or not an abnormality occurs in the common mode voltage in the cathode line and a degree of the abnormality based on the outputs of the first comparator 413*c*1 and second comparator 413*c*2. For example, it is assumed that the reference voltage Vref1 is greater than the reference voltage Vref2. In this case, if the output from the second comparator 413*c*2 indicates that the output voltage of the voltage divider 412*a* does not exceed the reference voltage Vref2, the controller 414 determines that the common mode voltage is normal. While the output from the second comparator 413*c*2 indicates that the output voltage of the voltage divider 412*a* exceeds the reference voltage Vref2, if the output from the first comparator 413*c*1 indicates that the output voltage of the voltage divider 412*a* does not exceed the reference voltage Vref1, the controller 414 determines that an abnormality level of the common mode voltage is 1. Finally, if the output from the first comparator 413*c*1 indicates that the output voltage of the voltage divider 412*a* exceeds the reference voltage Vref1, the controller 414 determines that the abnormality level of the common mode voltage is 2. This operation may be similarly applied to the third comparator 413*d*1 and the fourth comparator 413*d*2.

The controller 414 may determine the abnormality level of the common mode voltage in a plurality of stages based on the plurality of reference voltages described above, and may change a corresponding operation according to the determined abnormality level. For example, when the abnormality level is low, the error may be notified only to the battery system 10, and when the abnormality level is high, the error may be notified to an upper level controller such as the battery system controller 30.

Even when the monitoring device 40*b* described above is used, it is possible to accurately monitor the common mode voltage, similar to the monitoring device 40*a* according to FIG. 4. As a result, it is possible to stably operate the battery system 10 and furthermore the power system 1.

Further, the monitoring device 40*b* according to this embodiment may distinguish and grasp the degree of abnormality occurring in the common mode voltage by comparing the common mode voltage with a plurality of reference voltages. The monitoring device 40b according to the present embodiment may respond in different ways depending on the abnormality level.

Figure 6:
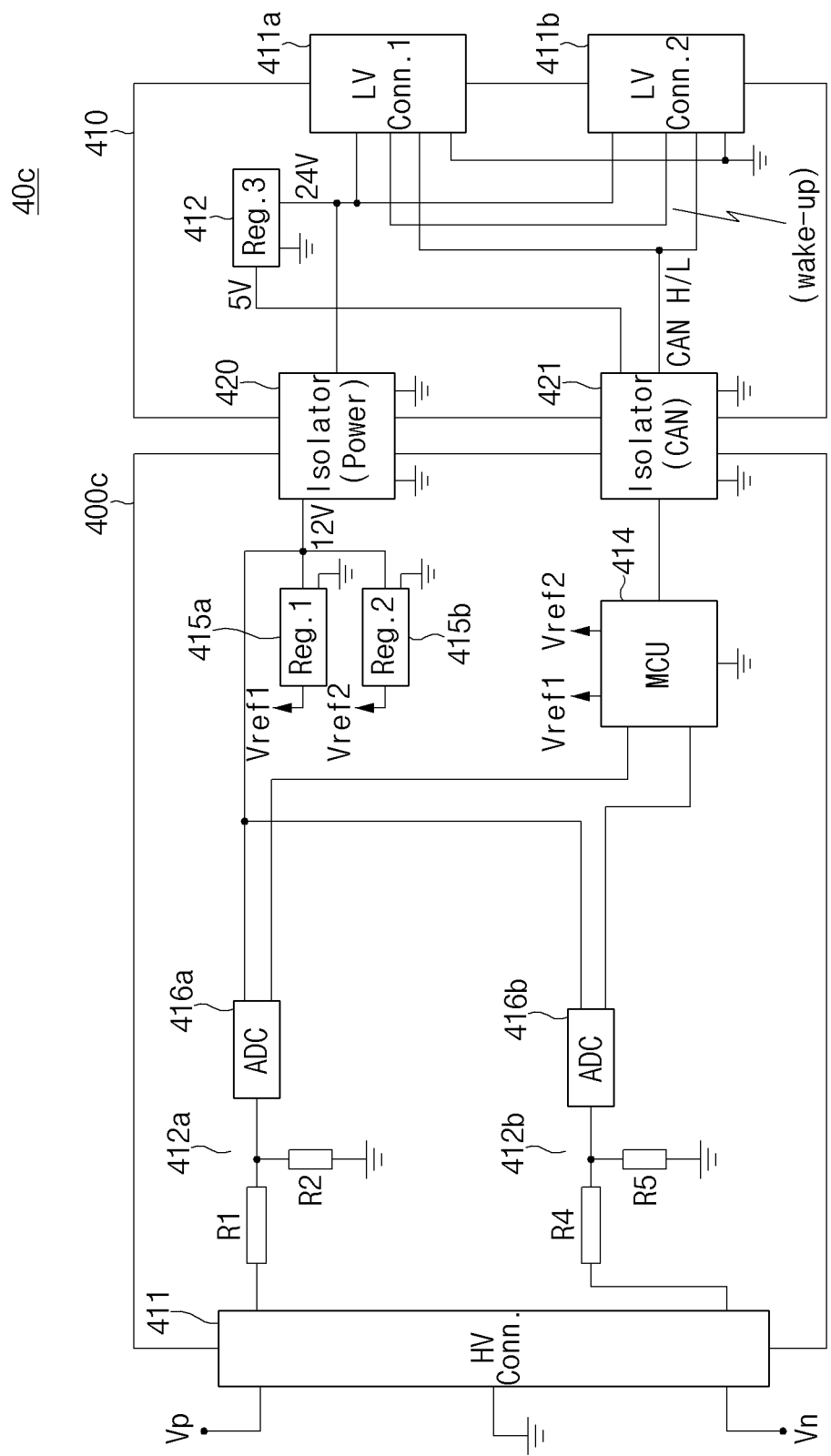
FIG. 6 is a diagram illustrating the configuration of the device for monitoring the common mode voltage according to still another embodiment of the present invention.

FIG. 6 is a diagram illustrating a configuration of a common mode voltage monitoring device 40c according to another embodiment of the present invention. Unlike the monitoring device 40a according to FIG. 4 and the monitoring device 40b according to FIG. 5, the monitoring device 40c according to FIG. 6 includes analog-to-digital converters 416a and 416b instead of the comparators. Hereinafter, the difference described above will be mainly described.

Referring to FIG. 6, the monitoring device 40c according to this embodiment converts the outputs of the voltage dividers 412a and 412b into digital values in the analog-to-digital converters 416a and 416b, respectively. Then, the digital values, which are the outputs of the analog-to-digital converters 416a and 416b, are applied to the controller 414.

The controller 414 stores digital values corresponding to a plurality of reference voltages such as reference voltage Vref1 and reference voltage Vref2. Further, the controller 414 compares the digital values applied from the analog-to-digital converters 416a and 416b with a digital value corresponding to the reference voltage. That is, unlike the analog comparison in the monitoring devices 40a and 40b of FIGS. 4 and 5, in this embodiment, a comparison is made between digital values. Thus, the controller 414 has a function as a comparator.

Even when the monitoring device 40c as described above is used, it is possible to accurately monitor the common mode voltage. As a result, it is possible to stably operate the battery system 10 and furthermore the power system 1.

In summary, the monitoring device 40 is a device connected to the node between the battery system 10 and the power conversion device 20, which is an energy storage device. The voltage divider of the monitoring device 40 first divides the voltage between the node between the battery system 10 and the power conversion device 20 and the chassis used as the ground of the battery system 10. Further, the comparator of the monitoring device 40 compares the divided voltage with the reference voltage. Thereafter, the controller of the monitoring device 40 detects an abnormality in the voltage applied from the power conversion device to the energy storage device based on the comparison result. The common mode voltage abnormality can be detected by the control method of the monitoring device 40 as described above.

Figure 7:
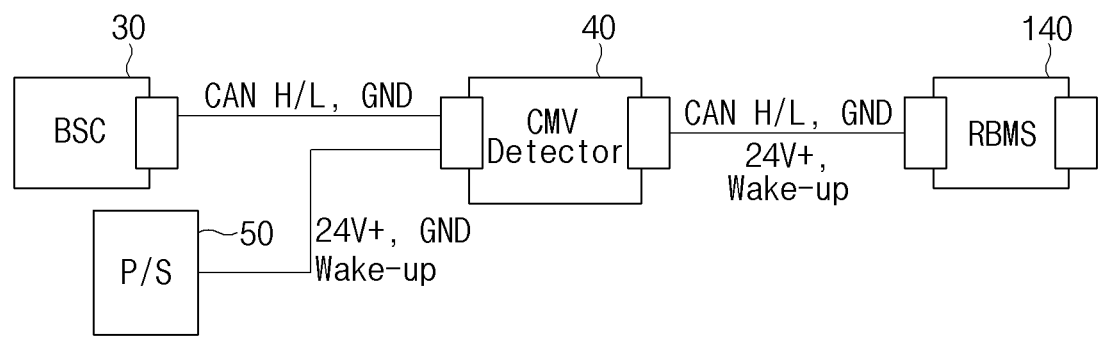
FIG. 7 is a diagram illustrating a connection configuration of the device for monitoring the common mode voltage according to the embodiment of the present invention.

FIG. 7 is a diagram illustrating an example of a connection configuration of the common mode voltage monitoring device 40 according to the embodiment of the present invention.

Referring to FIG. 7, the monitoring device 40 is connected to the rack controller 140 through a terminal portion of the low voltage circuit portion. The monitoring device 40 may be connected to the rack controller 140 through a CAN H/L channel to perform communication. Further, for the connection between the monitoring device 40 and the rack controller 140, a line for supplying power and a line for transmitting the wake-up signal are further included.

Further, the monitoring device 40 is connected to the battery system controller 30 through another terminal portion of the low voltage circuit portion. The monitoring device 40 and the battery system controller 30 may only be provided with a CAN H/L channel for communication.

In addition, the monitoring devices 40 may be connected to the power supply 50 and supplied with power.

In the case of the connection configuration according to FIG. 7, when the monitoring device 40 detects that an abnormality has occurred in the common mode voltage, the monitoring device 40 may selectively transmit an error notification to the rack controller 140 and the battery system controller 30. The monitoring device 40 may select a destination for transmitting the error notification according to the abnormality level occurring in the common mode voltage.

Figure 8:
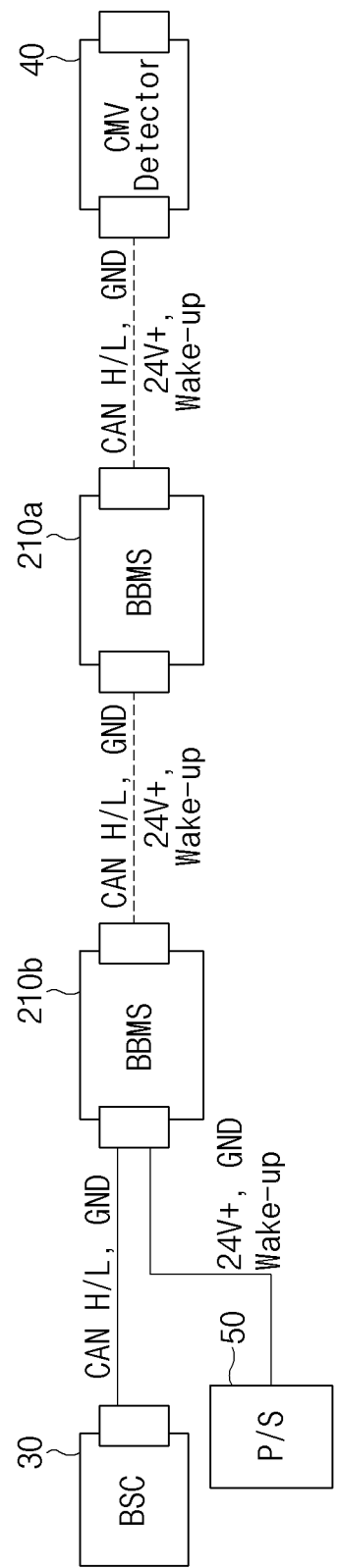
FIG. 8 is a diagram illustrating another example of the connection configuration of the device for monitoring the common mode voltage according to the embodiment of the present invention.

FIG. 8 is a diagram illustrating another example of the connection configuration of the common mode voltage monitoring device 40 according to the embodiment of the present invention.

Referring to FIG. 8, the monitoring device 40 may be configured to be positioned at a termination and sequentially connected to a bank controller 210a and a bank controller 210b. Further, the battery system controller 30 and the power supply 50 are connected to the bank controller 210b.

In the case of the connection configuration according to FIG. 8, when detecting that an abnormality has occurred in the common mode voltage, the monitoring device 40 transmits the fact that the abnormality has occurred only to the bank controller 210a. Further, the bank controller 210a may determine whether to transmit an error notification to the battery system controller 30 according to the abnormality level generated in the common mode voltage.

Figure 9:
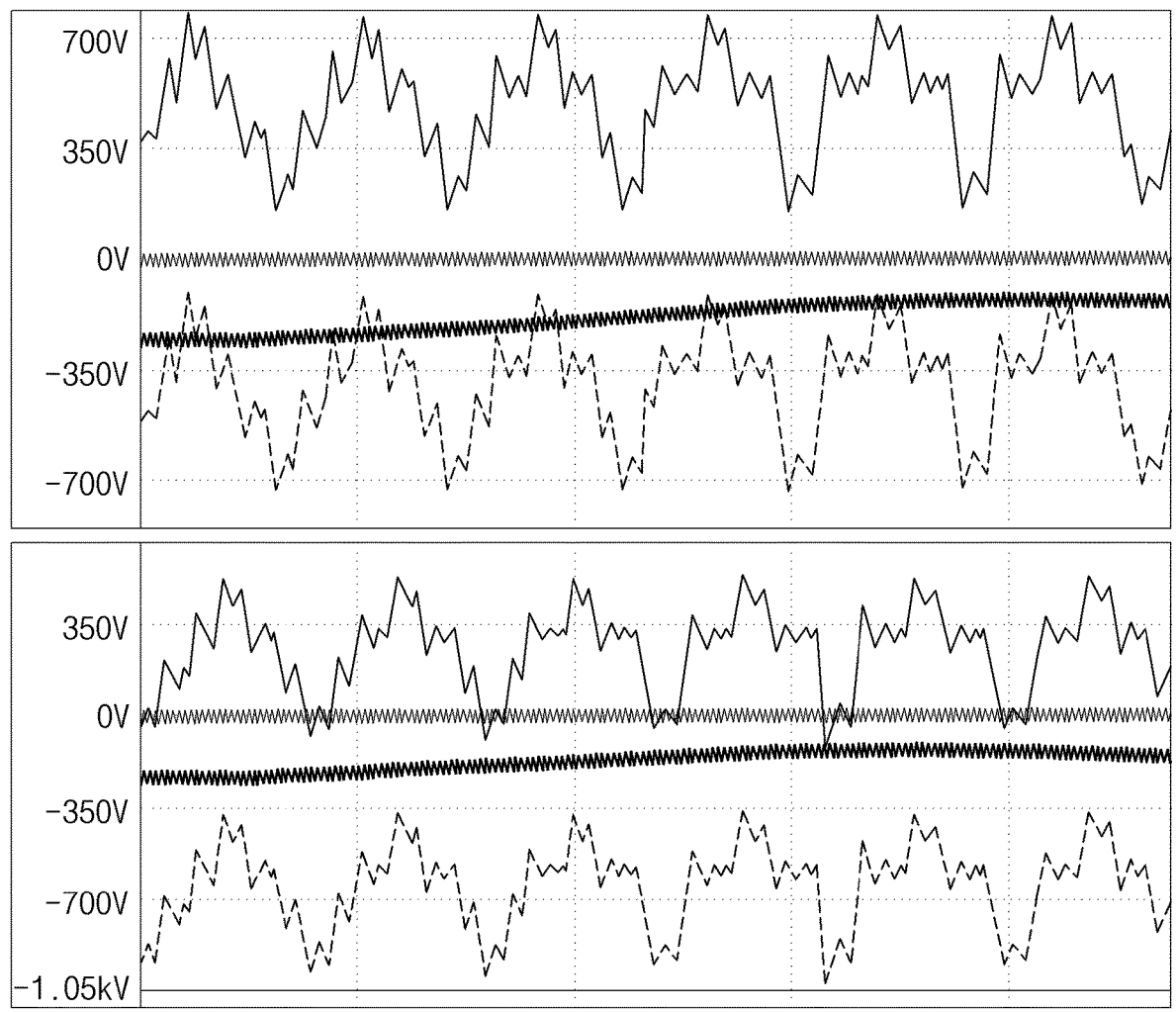
FIG. 9 is a waveform diagram of a voltage measured using the device for monitoring the common mode voltage according to the embodiment of the present invention.

FIG. 9 is a waveform diagram of a voltage measured using the common mode voltage monitoring device according to the embodiment of the present invention.

Referring to FIG. 9, the upper waveform shows a case where the common mode voltage is normal. When the common mode voltage is normal, the voltage of the cathode line was detected to be approximately 800 V and the voltage of the anode line was detected to be approximately −720 V compared to the ground 0 V (the frequency at which the peak value was represented is approximately 50 kHz). In this case, no error notification has occurred in the monitoring device 40.

Meanwhile, the waveform at the bottom shows a case where the abnormality has occurred in the common mode voltage. As can be seen from the waveform, the common mode voltage was biased toward the negative side due to noise caused by switching of the power converter. The voltage of the cathode line was detected to be approximately 500 V, and the voltage of the anode line was detected to be approximately −1050 V (the frequency when the peak value was represented is approximately 50 kHz). In this case, the value obtained by dividing the common mode voltage in the monitoring device 40 exceeded the reference value, and an abnormality in the common mode voltage was detected.

As described above, it was confirmed that the abnormality of the common mode voltage through the monitoring device 40 can be accurately monitored.

Further, the terms such as "include", "configure" or "have" described above mean that the corresponding constituent element may be embedded unless otherwise described, and thus the terms should be interpreted as being capable of further including other constituent elements, rather than excluding other constituent elements. All terms used herein including technical or scientific terms may be interpreted as having the same meaning as generally understood by a person of ordinary skill in the art, unless otherwise defined. Terms generally used, such as terms defined in the dictionary, should be interpreted as being consistent with the meaning of the context of related technology, and are not to be interpreted as an ideal or excessively formal meaning unless explicitly defined in the present invention.

The above description is merely illustrative of the technical idea of the present invention, and those of ordinary skill in the art to which the present invention pertains will be able to make various modifications and variations without deviating from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the claims set forth below, and all technical ideas within the scope equivalent thereto should be construed as being included in the scope of the present invention.

The invention claimed is:

1. A device for monitoring a common mode voltage, the device comprising:
    a high voltage circuit including:
        a regulator that receives power from a low voltage circuit and generates at least one reference voltage;
        an input end connected to a node between an energy storage device and a power conversion device;
        a voltage divider that divides a voltage applied to the input end;
        a comparator that compares an output of the voltage divider and the at least one reference voltage generated by the regulator; and
        a controller connected to the comparator and detecting an abnormality in a voltage applied from the power conversion device to the energy storage device based on an output of the comparator.

2. The device of claim 1,
    wherein the at least one reference voltage includes a first reference voltage and a second reference voltage,
    wherein the comparator includes a first comparator and a second comparator,
    wherein the first comparator is configured to compare the first reference voltage with the output of the voltage divider, and
    wherein the second comparator is configured to compare the second reference voltage with the output of the voltage divider.

3. The device of claim 1,
    wherein the comparator is connected to the controller, and compares a value obtained by converting the output of the voltage divider into a digital value with a digital value corresponding to the at least one reference voltage.

4. The device of claim 1,
    wherein the controller transmits an error signal to outside of the device when an abnormality is detected, by the controller, in voltage applied to the energy storage device from the power conversion device.

5. The device of claim 4,
    wherein the controller transmits the error signal to an upper level controller that manages the energy storage device and controls the power conversion device.

6. The device of claim 1,
    wherein the voltage applied to the input end is a voltage between the node and a ground of the energy storage device.

7. A device for monitoring a common mode voltage, the device comprising:
    a high voltage circuit including:
        a regulator that receives power from a low voltage circuit and generates at least one reference voltage;
        an input end connected to a node between an energy storage device and a power conversion device;
        a voltage divider that divides a voltage applied to the input end;
        a comparator that compares an output of the voltage divider and the at least one reference voltage generated by the regulator; and
        a controller connected to the comparator and detecting an abnormality in a voltage applied from the power conversion device to the energy storage device based on an output of the comparator,
    wherein the low voltage circuit includes:
        a terminal portion for communicating with outside of the device and for supplying the power to the regulator; and
        a power supply portion connected to the terminal portion and generating power based on an input from the terminal portion, wherein the power generated by the power supply portion is supplied to the controller.

8. The device of claim 7, further comprising:
    an isolator formed between the high voltage circuit and the low voltage circuit to insulate the power from the low voltage circuit to the high voltage circuit.

9. The device of claim 8,
    wherein the isolator includes:
    a power isolator for supplying power from the low voltage circuit to the high voltage circuit; and
    a communication isolator for transmitting the input from the terminal portion to the controller.

10. A device for monitoring a common mode voltage, the device comprising:
    a high voltage circuit including:
        a regulator that receives power from a low voltage circuit and generates at least one reference voltage;
        an input end connected to a node between an energy storage device and a power conversion device;
        a voltage divider that divides a voltage applied to the input end;
        a comparator that compares an output of the voltage divider and the at least one reference voltage generated by the regulator;
        a controller connected to the comparator and detecting an abnormality in a voltage applied from the power conversion device to the energy storage device based on an output of the comparator; and
    a battery management system that controls charging and discharging of the energy storage device,
    wherein the controller transmits an error signal to outside of the device when an abnormality is detected, by the controller, in voltage applied to the energy storage device from the power conversion device, and
    wherein the controller transmits the error signal to the battery management system.

11. The device of claim 10, wherein the low voltage circuit includes:
    a terminal portion for supplying the power to the regulator; and
    a power supply portion generating power based on an input from the terminal portion for supply to the controller.

12. The device of claim 11, further comprising an isolator to insulate the power from the low voltage circuit to the high voltage circuit.

13. A method of controlling a device for monitoring a common mode voltage connected to a node between an energy storage device and a power conversion device, the method comprising:
- dividing, via a voltage divider of a high voltage circuit, a voltage between the node and a ground of the energy storage device;
- comparing, by a comparator of the high voltage circuit, the divided voltage and at least one reference voltage generated by a regulator that receives power from a low voltage circuit; and
- detecting, via a controller of the high voltage circuit, an abnormality in a voltage applied from the power conversion device to the energy storage device based on a comparison result.

14. The method of claim 13, wherein the at least one reference voltage includes a first reference voltage and a second reference voltage,
- wherein the comparator includes a first comparator and a second comparator,
- wherein the method further comprises:
- comparing, by the first comparator, the first reference voltage with the output of the voltage divider; and
- comparing, by the second comparator, the second reference voltage with the output of the voltage divider.

15. The method of claim 13, wherein the low voltage circuit includes:
- a terminal portion; and
- a power supply portion connected to the terminal portion, and
- wherein the method further comprises:
  - by the terminal portion, communicating with outside of the device and supplying the power to the regulator;
  - generating, by the power supply portion, power based on an input from the terminal portion; and
  - supplying the power generated by the power supply portion to the controller.

16. The method of claim 13, further comprising:
- an isolator formed between the high voltage circuit and the low voltage circuit, and
- wherein the method further comprises insulating, by the isolator, the power from the low voltage circuit to the high voltage circuit.

17. The method of claim 16, wherein the isolator includes:
- a power isolator; and
- a communication isolator, and
- wherein the method further comprises:
  - supplying power, by the power isolator, from the low voltage circuit to the high voltage circuit; and
  - transmitting, by the communication isolator, an input from the terminal portion to the controller.

18. The method of claim 13, further comprising transmitting, by the controller, an error signal to outside of the device.

19. The method of claim 18, further comprising controlling, by a battery management system, charging and discharging of the energy storage device,
- wherein the transmitting, by the controller, the error signal to outside of the device includes transmitting, by the controller, the error signal to the battery management system.

20. The method of claim 18, wherein the transmitting, by the controller, the error signal to outside of the device includes transmitting, by the controller, the error signal to an upper level controller that manages the energy storage device, and
- wherein the method further comprises controlling, by the controller, the power conversion device.

* * * * *